(12) United States Patent
Park et al.

(10) Patent No.: US 8,404,580 B2
(45) Date of Patent: Mar. 26, 2013

(54) METHODS FOR FABRICATING SEMICONDUCTOR DEVICES

(75) Inventors: Sang-Jine Park, Yongin-si (KR); Bo-Un Yoon, Seoul (KR); Jeong-Nam Han, Seoul (KR); Yoon-Hae Kim, Yongin-si (KR); Doo-Sung Yun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/444,175

(22) Filed: Apr. 11, 2012

(65) Prior Publication Data

US 2012/0309189 A1 Dec. 6, 2012

(30) Foreign Application Priority Data

May 30, 2011 (KR) .................. 10-2011-0051465

(51) Int. Cl.
*H01L 21/4763* (2006.01)

(52) U.S. Cl. ........ 438/627; 438/638; 438/640; 438/700; 257/E21.577; 257/E21.579

(58) Field of Classification Search .................. 438/627, 438/629, 637, 638, 640, 643, 700; 257/E21.577, 257/E21.578, E21.579
See application file for complete search history.

(56) References Cited

U.S. PATENT DOCUMENTS

| 6,743,711 | B2 | 6/2004 | Kim | |
|---|---|---|---|---|
| 6,872,666 | B2 * | 3/2005 | Morrow | 438/700 |
| 7,141,507 | B2 * | 11/2006 | Genz et al. | 438/719 |
| 7,393,777 | B2 * | 7/2008 | Cooney et al. | 438/637 |
| 2003/0003716 | A1 | 1/2003 | Kim | |
| 2012/0129337 | A1 * | 5/2012 | Chen et al. | 438/636 |

FOREIGN PATENT DOCUMENTS

| KR | 1020030000821 | 1/2003 |
|---|---|---|
| KR | 1020040066999 | 7/2004 |
| KR | 1020100109173 | 10/2010 |

* cited by examiner

*Primary Examiner* — Tuan N. Quach
(74) *Attorney, Agent, or Firm* — Onello & Mello, LLP

(57) ABSTRACT

In a method for fabricating a semiconductor device, a semiconductor device is provided including an interlayer dielectric film and first and second hard mask patterns sequentially stacked thereon. A first trench is provided in the interlayer dielectric film through the second hard mask pattern and the first hard mask pattern. A filler material is provided on the interlayer dielectric film and the first and second hard mask patterns to fill the first trench. First and second hard mask trimming patterns are formed by trimming sidewalls of the first and second hard mask patterns and removing the filler material to expose the first trench. A damascene wire is formed by filling the first trench with a conductive material.

20 Claims, 16 Drawing Sheets

FIG. 4
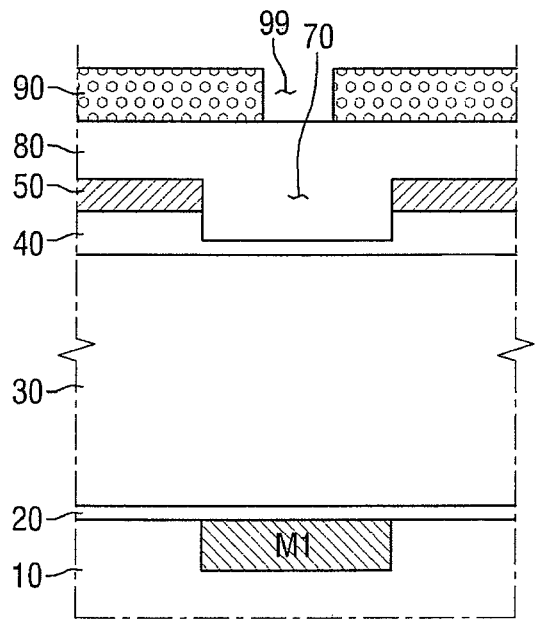
FIG. 5A
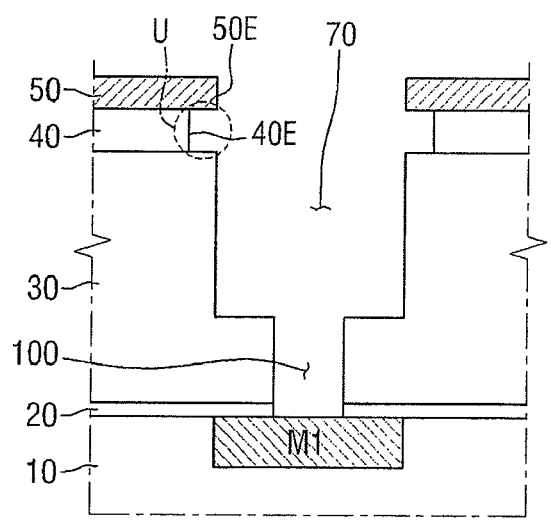
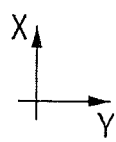

METHODS FOR FABRICATING SEMICONDUCTOR DEVICES

CROSS-REFERENCE TO RELATED APPLICATION

This application claims priority under 35 U.S.C. 119 from Korean Patent Application No. 10-2011-0051465, filed on May 30, 2011 in the Korean Intellectual Property Office, the content of which is herein incorporated by reference, in its entirety.

BACKGROUND

1. Field

Embodiments of the present inventive concepts relate to methods for fabricating semiconductor devices.

2. Description of the Related Art

In the fabrication of semiconductor-based transistor devices, it is commonplace for many photo masks to be used for the various required etching steps. However, with increased integration of semiconductor devices, the number of required etching steps is increasing, as is the depth of an etched feature relative to its width. Accordingly, the resulting processing variation can increase by a proportional amount. In order to minimize processing variation, a hard mask process has recently been proposed to perform etching steps. More recently, in order to increase etching selectivity, a metal hard mask has also been introduced.

SUMMARY

Embodiments of the present inventive concepts provide a method for fabricating a semiconductor device, which can form a damascene-type wire in a manner that offers improved reliability and improved processing efficiency. This can result in a device that offers reduced process variation and improved reliability.

In one aspect, a method for fabricating a semiconductor device comprises: providing a semiconductor device including an interlayer dielectric film and first and second hard mask patterns sequentially stacked thereon; providing a first trench in the interlayer dielectric film through the second hard mask pattern and the first hard mask pattern; providing a filler material on the interlayer dielectric film and the first and second hard mask patterns to fill the first trench; forming first and second hard mask trimming patterns by trimming sidewalls of the first and second hard mask patterns and removing the filler material to expose the first trench; and forming a damascene wire by filling the first trench with a conductive material.

In some embodiments, sidewalls of the first and second hard mask patterns in the region of the trench have a negative slope.

In some embodiments, the first hard mask pattern has an undercut formed therein, relative to the second hard mask pattern.

In some embodiments, the trimming comprises forming the first and second hard mask trimming patterns to have sidewalls of a positive slope.

In some embodiments, the forming of the first and second hard mask trimming patterns is performed using a dry etching process.

In some embodiments, the dry etching process includes a first dry etching process to form first and second hard mask trimming patterns by trimming the sidewalls of the first and second hard mask patterns while removing the filler material to expose an upper surface of the first trench using a first gas, and a second dry etching process to remove the filler material in the first trench using a second gas.

In some embodiments, the first hard mask pattern and the filler material have higher etching selectivity to the first gas than the second hard mask pattern, and wherein the filler material has higher etching selectivity to the second gas than the first and second hard mask patterns.

In some embodiments, the first hard mask pattern includes tetraethyl orthosilicate (TEOS), the second hard mask pattern includes titanium nitride (TiN), and the filler material includes at least one of near frictionless carbon (NFC) and spin-on hard mask (SOH).

In some embodiments, before the forming of the damascene wire, the method further comprises forming a barrier layer along sidewalls and a bottom surface of the first trench and along sidewalls and a top surface of the first and second hard mask trimming patterns.

In some embodiments, the forming of the damascene wire comprises: forming the conductive material on the barrier layer to fill the first trench; and planarizing to expose a top surface of the interlayer dielectric film.

In some embodiments, the first trench is provided in a first region of the interlayer dielectric film, and further comprising providing a second trench in the interlayer dielectric film through a third hard mask pattern and a fourth hard mask pattern in a second region of the interlayer dielectric film; wherein providing a filler material further comprises providing the filler material to fill the second trench; wherein forming of the first and second hard mask trimming patterns further comprises forming third and fourth hard mask trimming patterns by trimming sidewalls of the third and fourth hard mask patterns and removing the filler material to expose the second trench; and wherein forming the damascene wire further comprises filling the second trench with a conductive material.

In some embodiments, a height difference between the second hard mask trimming pattern and the fourth hard mask trimming pattern is less than a height difference between the second hard mask pattern and the fourth hard mask pattern.

In another aspect, a method for fabricating a semiconductor device comprises: providing a semiconductor device including an interlayer dielectric film and first and second hard mask patterns sequentially stacked thereon; providing a first trench in the interlayer dielectric film through the second hard mask pattern and the first hard mask pattern, inner ends of the second hard mask pattern overlapping undercut portions of inner ends of the first hard mask pattern; providing a filler material on the interlayer dielectric film and the first and second hard mask patterns to fill the first trench; forming first and second hard mask trimming patterns by trimming the inner ends of the first and second hard mask patterns and removing the filler material to expose the first trench; the second hard mask trimming pattern exposing at least a portion of the inner end of the first hard mask trimming pattern; forming a barrier layer along sidewalls and a bottom surface of the first trench and along sidewalls and a top surface of the first and second hard mask trimming patterns; and forming a damascene wire by filling the first trench with a conductive material.

In some embodiments, an upper surface area of the first trench exposed by the first and second hard mask trimming patterns is larger than an upper surface area of the first trench exposed by the first and second hard mask patterns.

In some embodiments, the first trench is provided in a first region of the interlayer dielectric film, and further comprising providing a second trench in the interlayer dielectric film through a third hard mask pattern and a fourth hard mask pattern in a second region of the interlayer dielectric film; wherein providing a filler material further comprises providing the filler material to fill the second trench; wherein forming of the first and second hard mask trimming patterns further comprises forming third and fourth hard mask trimming patterns by trimming the inner ends of the third and fourth hard mask patterns and removing the filler material to expose the second trench; and wherein forming the damascene wire further comprises filling the second trench with a conductive material.

In some embodiments, an upper surface area of the first trench exposed by the first and second hard mask trimming patterns is larger than an upper surface area of the first trench exposed by the first and second hard mask patterns, and wherein an upper surface area of the second trench exposed by the third and fourth hard mask trimming patterns is larger than an upper surface area of the second trench exposed by the third and fourth hard mask patterns.

In another aspect, a method of fabricating a semiconductor device, comprises: providing a first hard mask layer on an interlayer dielectric film and providing a second hard mask layer on the first hard mask layer, the second hard mask layer having etch selectivity relative to the first hard mask layer; forming a trench through the second hard mask layer, the first hard mask layer and the interlayer dielectric film, the trench forming a first opening through the first hard mask layer and the trench forming a second opening through the second hard mask layer, the first opening being larger in area that the second opening; filling the trench with a filler material, the filler material at least partially filling the trench in the interlayer dielectric film, and the first and second openings; trimming the first and second openings in the first and second hard mask layers so that the second opening is larger in area than the first opening; removing the filler material to expose a component of the semiconductor device positioned below the interlayer dielectric film.

In some embodiments, the method further comprises: after removing the filler material, conformally forming a barrier layer on sidewalls and a bottom of the trench; and filling the trench, including the barrier layer, with a conductive material.

In some embodiments, after forming the trench, the first opening is larger in area that the second opening, and inner sidewalls of the first and second openings have a negative slope; and after trimming the first and second openings, the second opening is larger in area that the first opening, and inner sidewalls of the first and second openings have a positive slope.

In some embodiments, after forming the trench, the first opening is larger in area that the second opening, and an undercut is present in the first opening below the second opening; and after trimming the first and second openings, the second opening is larger in area that the first opening, and the undercut is substantially removed.

BRIEF DESCRIPTION OF THE DRAWINGS

The above and other features and advantages of the present inventive concepts will become more apparent by describing in detail various embodiments thereof with reference to the attached drawings in which:

FIGS. 2 to 11 are cross-sectional views illustrating intermediate process steps in a method for fabricating a semiconductor device according to the flow chart of FIG. 1;

DETAILED DESCRIPTION OF EMBODIMENTS

Figure 1:
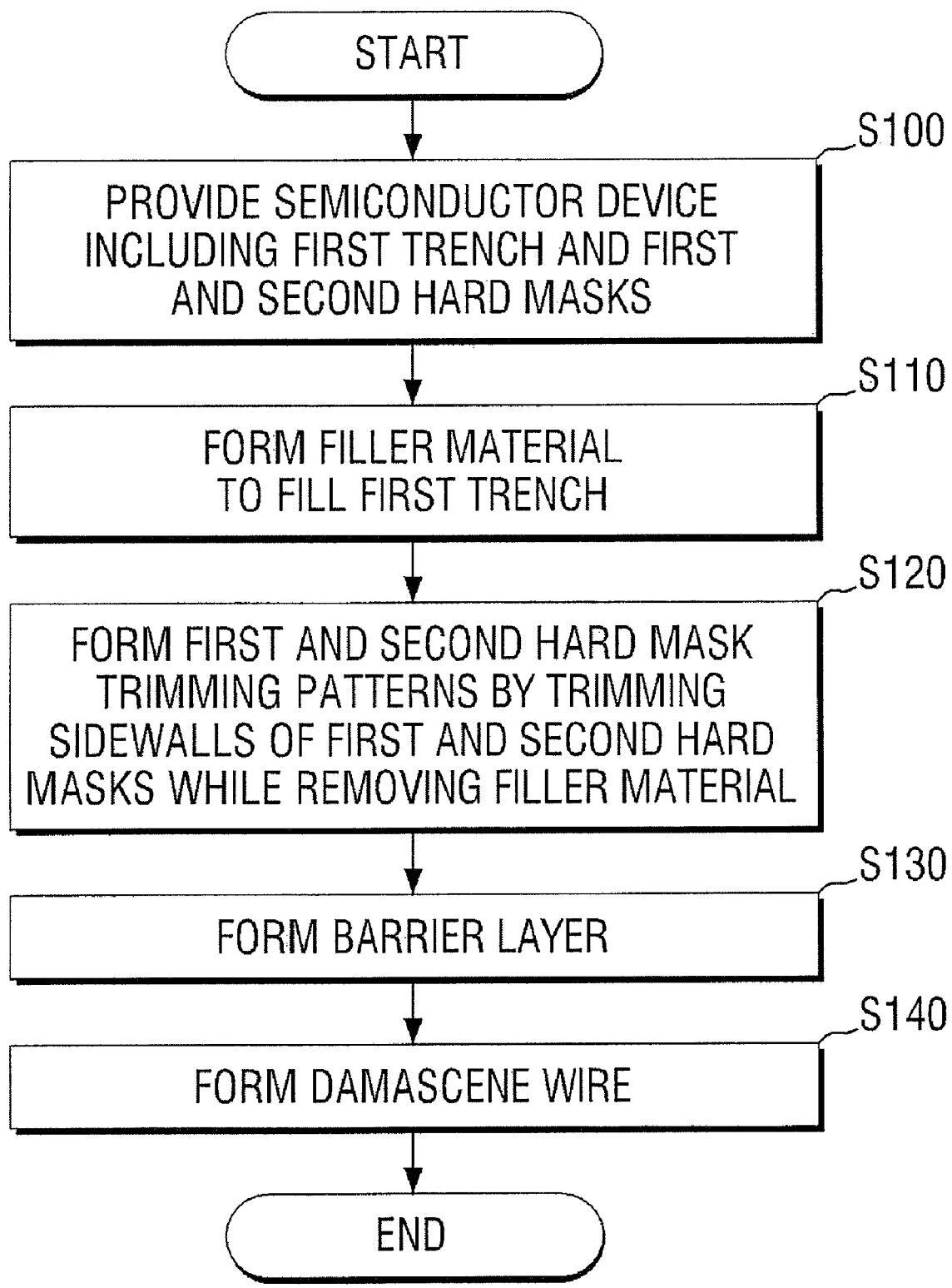
FIG. 1 is a flow chart illustrating a method for fabricating a semiconductor device according to an embodiment of the present inventive concepts.

Embodiments of the present inventive concepts will now be described more fully hereinafter with reference to the accompanying drawings, in which embodiments are shown. This inventive concepts may, however, be embodied in different forms and should not be construed as limited to the embodiments set forth herein. Like numbers refer to like elements throughout the specification.

It will be understood that, although the terms "first", "second", etc. are used herein to describe various elements, these elements should not be limited by these terms. These terms are used to distinguish one element from another. For example, a "first" element could be termed a "second" element, and, similarly, a "second" element could be termed a "first" element, without departing from the scope of the present inventive concepts. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

In the specification, it will be understood that when a layer (or film) is referred to as being 'on' another layer or substrate, it can be directly on the other layer or substrate, or intervening layers may also be present. In the drawings, the dimensions of layers and regions are exaggerated for clarity of illustration. Also, though terms like a first, a second, and a third are used to describe various regions and layers in various embodiments of the present inventive concepts, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. As used herein, the term 'and/or' includes any and all combinations of one or more of the associated listed items. Like reference numerals refer to like elements throughout.

Figure 5B:
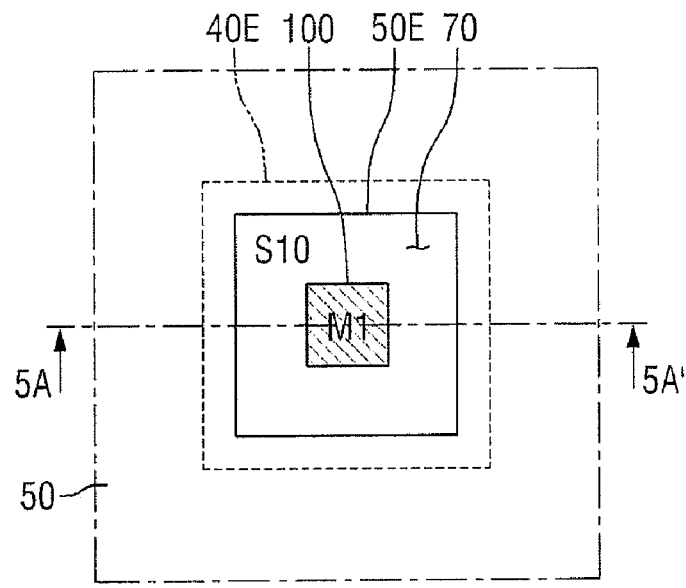

Hereinafter, a method for fabricating a semiconductor device according to an embodiment of the present inventive concepts will be described with reference to FIGS. 1 to 11. FIG. 1 is a flow chart illustrating a method for fabricating a semiconductor device according to an embodiment of the present inventive concepts, and FIGS. 2 to 11 are cross-sectional views illustrating intermediate process steps in a method for fabricating a semiconductor device according to the method shown in FIG. 1. Here, FIG. 5A is a cross-sectional view taken along line 5A-5A' of FIG. 5B, and FIG. 8A is a cross-sectional view taken along line 8A-8A' of FIG. 8B.

Referring to FIG. 1, a semiconductor device is provided, the semiconductor device including a first trench and first and second hard mask patterns (S100).

In further detail, a semiconductor device is provided, the semiconductor device including a first trench formed in an interlayer dielectric film, and first and second hard mask patterns sequentially stacked on the interlayer dielectric film while exposing the first trench. Hereinafter, an exemplary embodiment of the method for forming the semiconductor device will be described with reference to FIGS. 2 to 5B.

Figure 2:
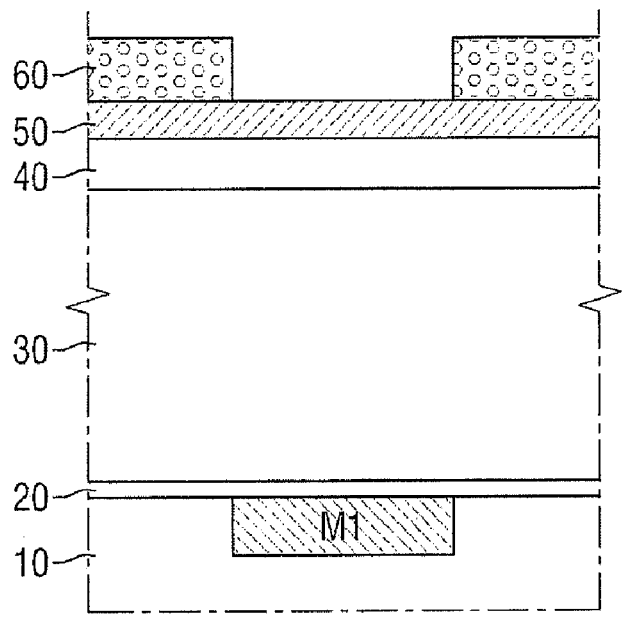

Referring to FIG. 2, an etch stopper layer 20, an interlayer dielectric film 30, a first hard mask pattern 40, and a second hard mask pattern 50 are sequentially stacked on an insulation layer 10 having a first wire M1 formed therein. A first photoresist pattern 60 to be used for forming a first trench (not shown) is formed on the second hard mask pattern 50.

Figure 3:
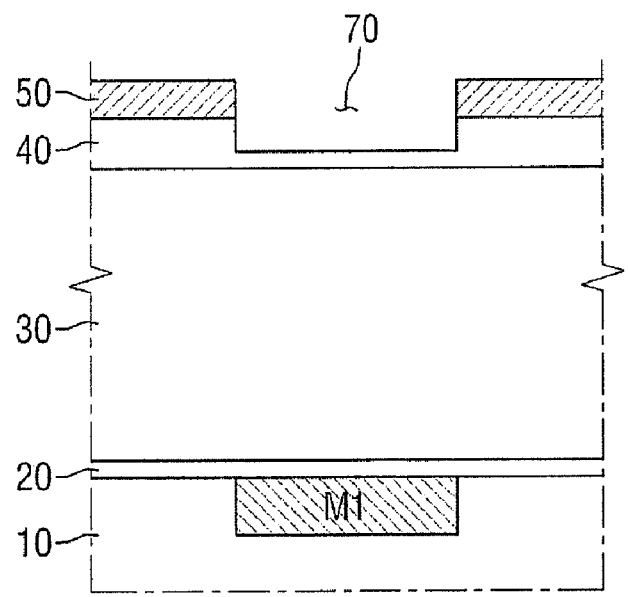

Referring to FIGS. 2 and 3, the first trench 70 is formed within the first and second hard mask patterns 40 and 50 using the first photoresist pattern 60 as an etch mask. In the present example embodiment, the first trench is formed through the second hard mask pattern 50 and partially through the first hard mask pattern 40. Other variations are possible and within the scope of the present inventive concepts.

Referring to FIG. 4, an etching layer 80 is formed on the first and second hard mask patterns 40 and 50 to fill the first trench 70, and a second photoresist pattern 90 having an opening 99 to be used for forming a first via hole (not shown) is formed on the etching layer 80.

Referring to FIGS. 4, 5A and 5B, the first etching layer 80 and portions of the first hard mask pattern 40 and the interlayer dielectric film 30 are etched using the second photoresist pattern 90 as an etch mask. This forms an initial, relatively narrow trench in the ILD film 30. Subsequently, the second photoresist pattern 90 and the first etching layer 80 are removed, and the interlayer dielectric film 30 and the etch stopper layer 20 are etched using the second hard mask pattern 50 as an etch mask. As a result, a first via hole 100 is formed through a lower portion of the ILD film 30 and the etch stopper layer 20. The upper portion of the first via hole 100 communicates with the first trench 70 which is formed through the upper portion of the ILD layer 30. The first trench 70 is relatively wider in dimension than the first via hole 100.

Referring to FIGS. 5A and 5B, the resulting semiconductor device structure may thus include a first via hole 100 and a first trench 70 formed in the interlayer dielectric film 30, and first and second hard mask patterns 40 and 50 sequentially stacked on the interlayer dielectric film 30 while exposing the first trench 70.

Sidewalls of the first and second hard mask patterns 40 and 50, in combination, may have an inwardly tapered, negative slope as a result of the etching process. In further detail, as a result of the etching process, the first hard mask pattern 40 may become over-etched in the horizontal direction (e.g., in the Y direction shown in FIG. 5A), as compared to the second hard mask pattern 50. Such over-etching of the first hard mask pattern may form an undercut U feature. In this case, an inner end 50E of the second hard mask pattern 50, as shown in FIG. 5A, protrudes further in the horizontal direction (e.g., in the Y direction) in a direction toward the first trench 70 than an inner end 40E of the first hard mask pattern 40. As described above, since the second hard mask pattern 50 is formed so as not to expose the inner end 40E of the first hard mask pattern 40, the sidewalls of the first hard mask pattern 40 and the second hard mask pattern 50 may collectively be considered to have a negative slope. Also, a first opening in the first hard mask pattern 40 can be considered to have an area that is greater than an area of the second opening in the second hard mask pattern, as a result of the overetching.

Referring to FIG. 5B, an upper surface of the bottom of the first trench 70 exposed by the first and second hard mask patterns 40 and 50 may have a first area S10. In detail, the upper surface of the bottom of the first trench 70 exposed by the inner end 50E, or inner edges, of the second hard mask pattern 50 may have the first area S10. While the illustration of FIG. 5B depicts the first trench 70 exposed by the first and second hard mask patterns 40 and 50 as having a rectangular shape, embodiments of the present inventive concepts are not limited thereto. Alternatively, the exposed portion of the first trench 70 may have various shapes such as curved, oval, or other suitable geometric shapes.

Referring back to FIG. 1, a filler material is provided to fill the first trench (S110). Further, first and second hard mask trimming patterns are formed by trimming the sidewalls of the first and second hard mask patterns while removing the filler material (S120).

In further detail, the filler material is formed on the interlayer dielectric film and the first and second hard mask patterns to fill the first trench, and the first and second hard mask trimming patterns are formed by trimming the sidewalls of the first and second hard mask patterns while removing the filler material to expose the first trench. This process will be described in further detail with reference to FIGS. 6 to 8B.

Figure 6:
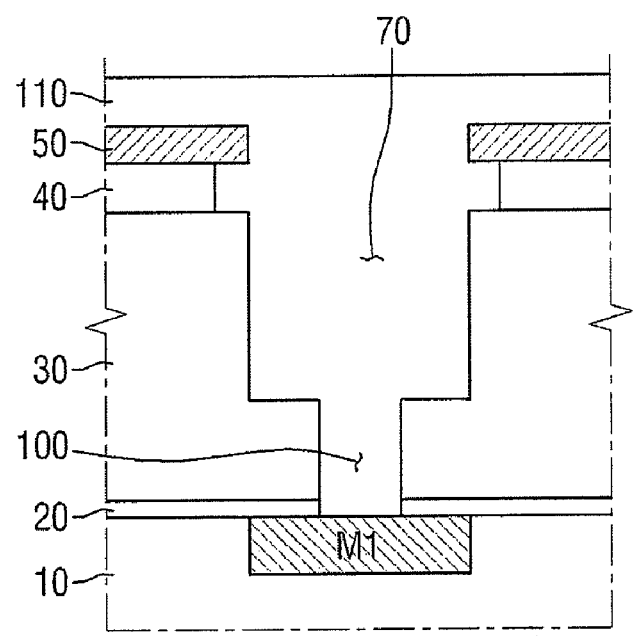

Referring to FIG. 6, a filler material 110 is formed on the interlayer dielectric film 30 and the first and second hard mask patterns 40 and 50 to fill the first trench 70. Here, the filler material 110 may also fill a first via hole 100, as shown, although a fill of the first via hole at the lower portion of the first trench 70 is not required.

Figure 7:
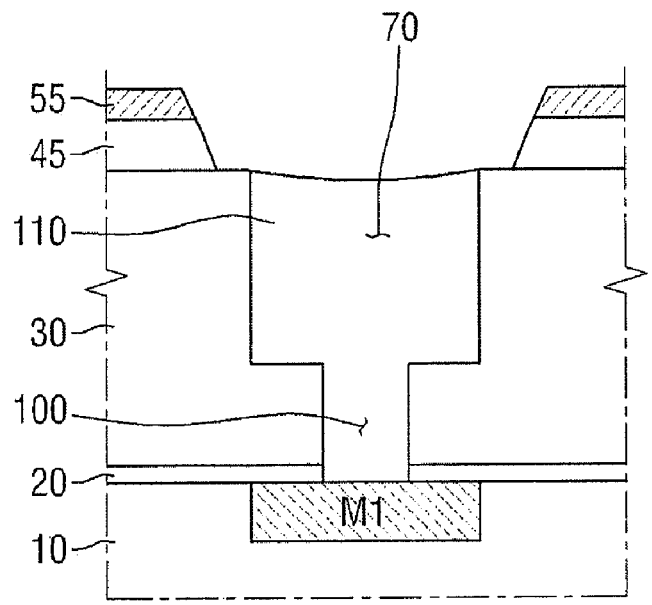
Figure 8A:
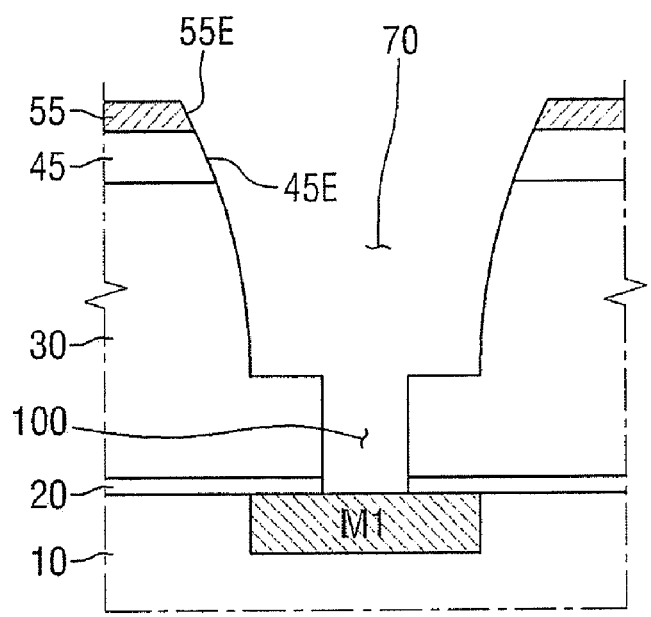

Next, referring to FIGS. 6 and 7, a first dry etching process is performed to farm first and second hard mask trimming patterns 45 and 55 by trimming the inner sidewalls of the first and second hard mask patterns 40 and 50 while removing at least an upper portion of the filler material 110 using a first gas to expose a portion of the filler material positioned at an upper portion of the first trench 70.

The first dry etching process may include, for example, a first process of removing the filler material 110 on the second hard mask pattern 50 until the second hard mask pattern 50 is exposed, and a second process of forming the first and second hard mask trimming patterns 45 and 55 by trimming the inner sidewalls of the first and second hard mask patterns 40 and 50 while removing the filler material 110 between the first and second hard mask patterns 40 and 50 upon exposure of the second hard mask pattern 50.

Figure 8B:
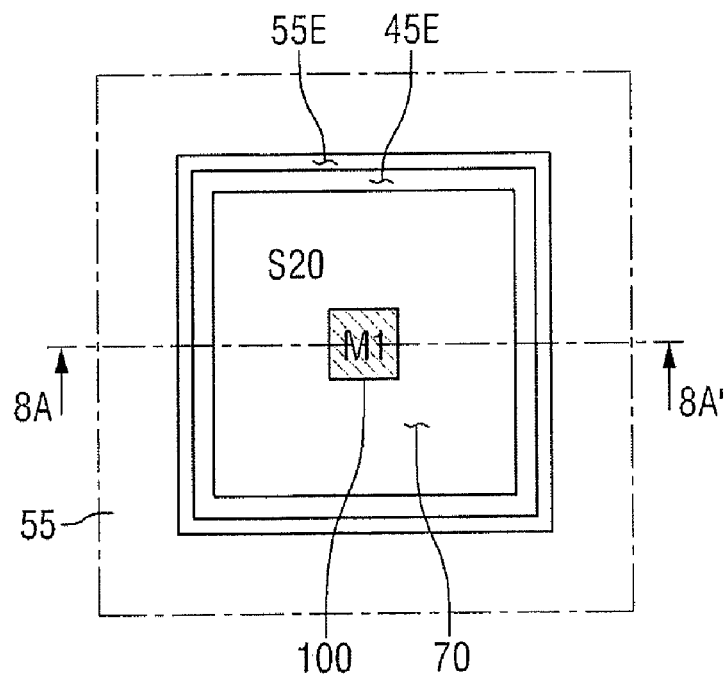
Figure 9:
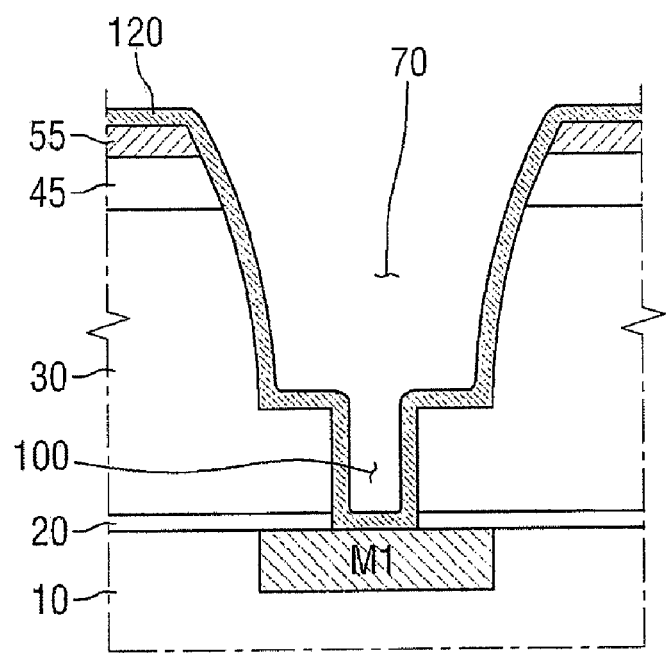

Referring to FIGS. 7, 8A and 8B, a second dry etching process is performed to remove a remaining portion of the filler material 110 within the first trench 70 and the first via hole 100 using a second gas. Here, the second dry etching process may be performed until the first wire Ml, the first via hole 100 and the first trench 70 are exposed.

Here, the sidewalls of the first and second hard mask trimming patterns 45 and 55 may have a positive slope.

In particular, as a result of the first and second dry etching process, the second hard mask pattern 50 becomes etched in the horizontal direction (e.g., in the X direction) to a greater degree than the first hard mask pattern 40. Accordingly, inner edges, or ends 55E of the formed second hard mask trimming pattern 55 may expose, in a vertical direction, inner edges, or ends, 45E of the first hard mask trimming pattern 45, as shown in FIG. 8A. Therefore, the sidewalls of the first hard mask trimming pattern 45 and the second hard mask trimming pattern 55 may be considered to have a positive slope. As a result, the area of the resulting second opening 55 in the second hard mask trimming pattern is greater than the area of the resulting first opening in the first hard mask trimming pattern 45.

In the first dry etching process, the first hard mask pattern 40 and the filler material 110 are to be etched to a greater degree than the second hard mask pattern 50. Thus, the material used for forming the first hard mask pattern 40 and the filler material 110 should have higher etching selectivity to the first gas used for the first dry etching process than the material used for forming the second hard mask pattern 50. In addition, in the second dry etching process, the filler material 110 is to be etched to a greater degree than the first and second hard mask trimming patterns 45 and 55. Thus, material used for forming the filler material 110 should have higher etching selectivity to the second gas used for the second dry etching process than the materials used for forming the first and second hard mask trimming patterns 45 and 55.

In some embodiments, the material used for forming the first hard mask pattern 40, which can satisfy the etching selectivity requirement may include, for example, tetraethyl orthosilicate (TEOS), the material used for forming the second hard mask pattern 50 may include, for example, titanium nitride (TiN), and the material used for the filler material 110 may include, for example, at least one of near frictionless carbon (NFC) and spin-on hard mask (SOH).

Referring to FIG. 8B, an upper surface of the first trench 70 exposed by the first and second hard mask trimming patterns 45 and 55 may have a second area S20. In detail, the upper surface of the first trench 70 exposed by, or exposed between, the ends or inner edges 45E of the first hard mask trimming pattern 45 may have the second area S20.

Here, the resulting second area S20 may be greater in area than the first area S10 of FIG. 5B, discussed above. The reason for this is that the first and second hard mask trimming patterns 45 and 55 are formed as a result of the etching, in the horizontal direction (e.g., in the Y direction), of the sidewalls of the first and second hard mask patterns 40 and 50 during the first and second dry etching process. The opening formed between the first and second hard mask trimming patterns 45 and 55 is widened as a result of the first and second dry etching process, and, accordingly, the resulting second area S20 is relatively larger.

While the top view of FIG. 8B illustrates the first trench 70 exposed by the first and second hard mask trimming patterns 45 and 55 as having a rectangular shape, embodiments of the present inventive concepts are not limited thereto. Alternatively, the exposed portion of the first trench 70 may have various shapes such as curved, oval, or other suitable geometric shapes.

Referring back to FIG. 1, a barrier layer is formed (S130). In detail, referring to FIG.

9, a barrier layer 120 is formed along sidewalls and bottom surfaces of the first trench 70 and the first via hole 100 and along sidewalls and a top surface of the first and second hard mask trimming patterns 45 and 55. Here, the barrier layer 120 may be formed by depositing a conductive material, for example, TiN/Ta, or other suitable conductive material, conformally along the sidewalls and bottom surfaces of the first trench 70 and conformally along the sidewalls and top surface of the first and second hard mask trimming patterns 45 and 55. In some embodiments, the deposition of the conductive material may comprise a plasma vapor deposition (PVD) or chemical vapor deposition (CVD) process.

Referring back to FIG. 1, a damascene wire is formed (S140). In detail, the damascene wire is formed by filling the first trench with a conductive material, as will be described in more detail with reference to FIGS. 10 and 11.

Figure 10:
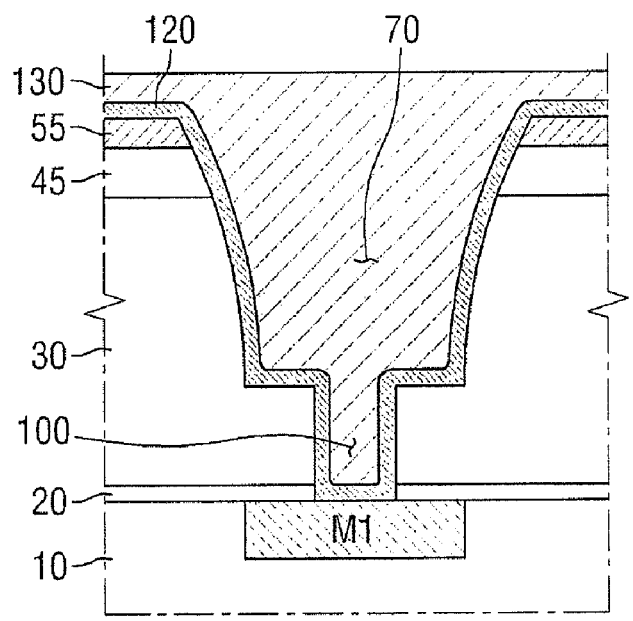

Referring first to FIG. 10, a conductive material 130 is formed on the barrier layer 120 to fill the first trench 70. Also, the conductive material 130 may be formed to fill the first via hole 100. The conductive material 130 may include, for example, copper (Cu). In some embodiments, the conductive material may be formed to fill the first via hole 100 and the first trench 70 by a plating process or other suitable process.

Figure 11:
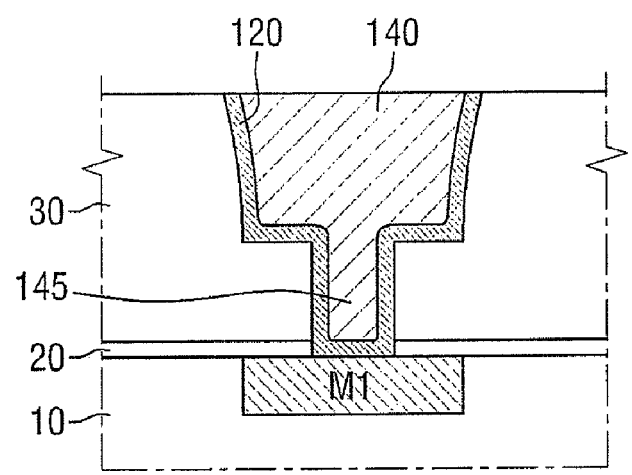

Next, referring to FIGS. 10 and 11, a planarizing process is performed to expose a top surface of the interlayer dielectric film 30. In detail, a first damascene wire 140 including a first via 145 may be formed by removing the first and second hard mask trimming patterns 45 and 55 by, for example, chemical mechanical polishing (CMP). By exposing the top surface of the interlayer dielectric film 30, neighboring damascene wires 140 are separated from each other to thereby form individual damascene wires.

Referring back to FIG. 9, in connection with embodiments of the present inventive concepts, the barrier layer 120 is formed in a state in which the underlying structure includes sidewalls of the first hard mask trimming pattern (45 in FIG. 8A) and sidewalls of the second hard mask trimming pattern (55 in FIG. 8A) that have a positive slope. Accordingly the barrier layer (120 in FIG. 9) can be reliably formed to continuously cover the first and second hard mask trimming patterns 55. Thus, it is possible to prevent voids from being generated when a conductive material (130 in FIG. 10) is formed on the underlying barrier layer (120 in FIG. 9) during subsequent processes. Since the first damascene wire 140 can be formed without the presence of voids, the reliability of the damascene wire 140 can be improved.

In contrast, in a fabrication approach in which the barrier layer is formed on an underlying structure that includes sidewalls of the first hard mask (40 in FIG. 5) and sidewalls of the second hard mask (50 in FIG. 5) that, in combination, have a negative slope, it is possible for the barrier layer to be formed to have a reduced portion, or open or "cut" portion, in the region of the undercut U. This in turn can lead to the formation of discontinuities in the later-applied conductive material to be formed on the underlying barrier layer, which can lead to reliability issues in the resulting device.

Figure 12:
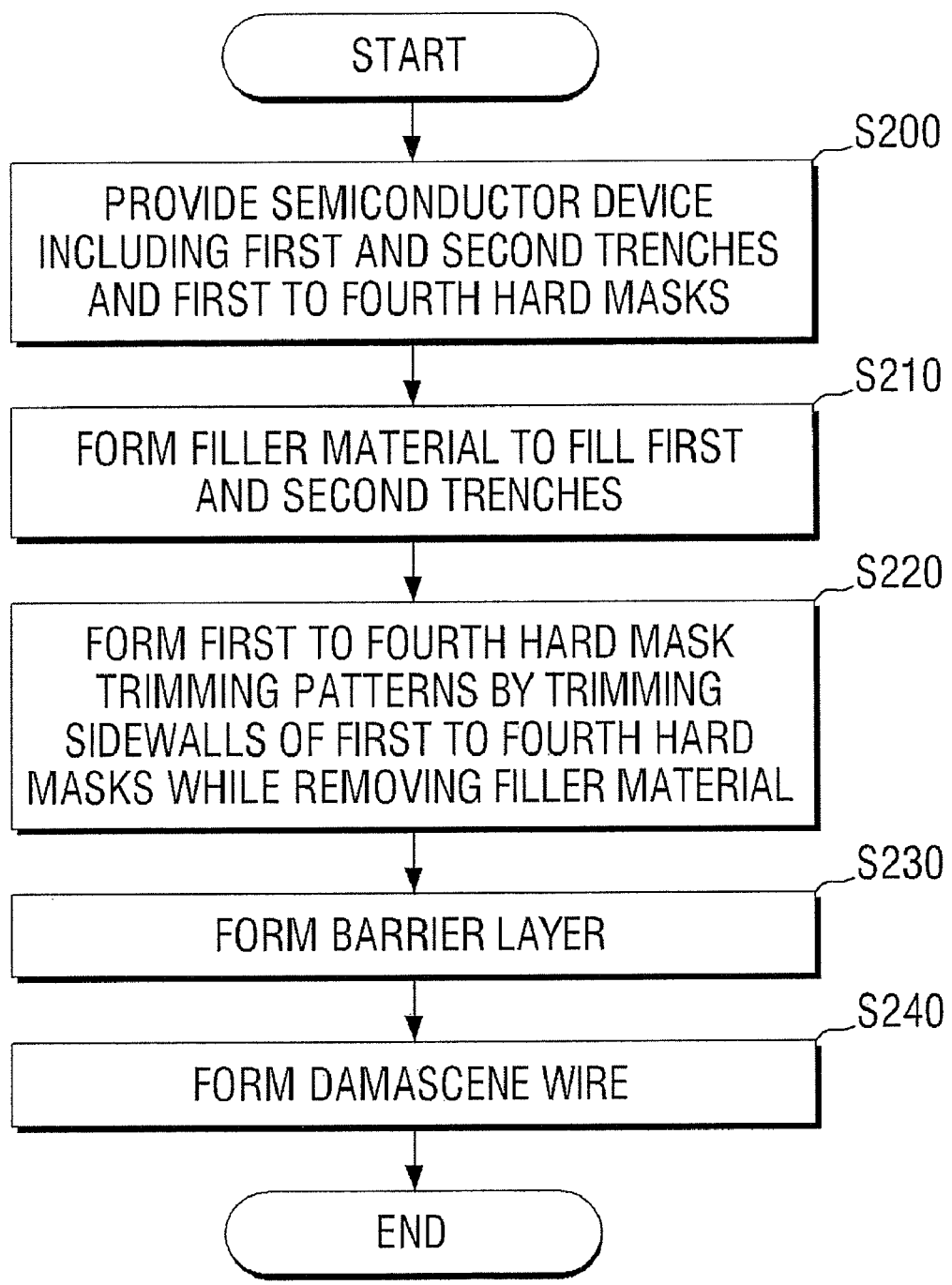
FIG. 12 is a flow chart illustrating a method for fabricating a semiconductor device according to another embodiment of the present inventive concepts.
Figure 19A:
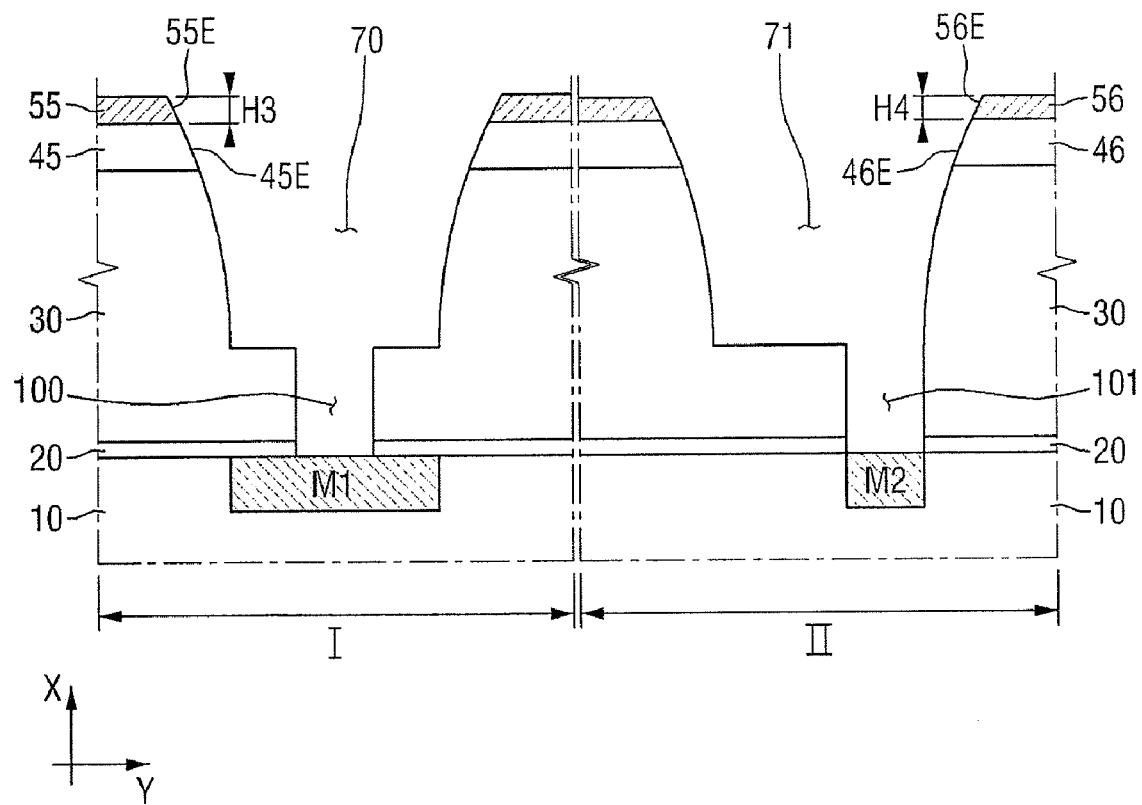
Figure 19B:
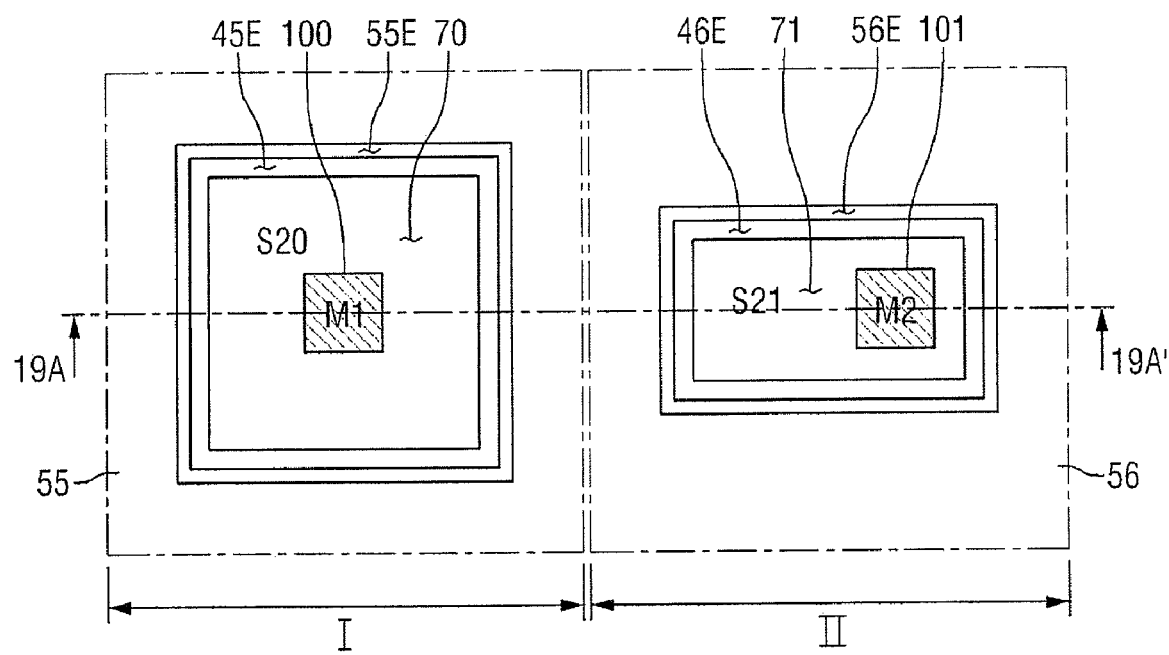

Methods for fabricating a semiconductor device according other embodiments of the present inventive concepts will now be described with reference to FIGS. 12 to 22. FIG. 12 is a flow chart illustrating a method for fabricating a semiconductor device according to other embodiments of the present inventive concepts, and FIGS. 13 to 22 are cross-sectional views illustrating intermediate process steps in the methods for fabricating a semiconductor devices shown in FIG. 12. Here, FIG. 16A is a cross-sectional view taken along the line 16A-16A' of FIG. 16B, and FIG. 19A is a cross-sectional view taken along the line 19A-19A' of FIG. 19B.

Referring to FIG. 12, a semiconductor device is provided, the semiconductor device including first and second trenches and first to fourth hard mask patterns (S200). Hereinafter, an exemplary embodiment of the method for forming the semiconductor device will be described with reference to FIGS. 13 to 16B.

Figure 13:
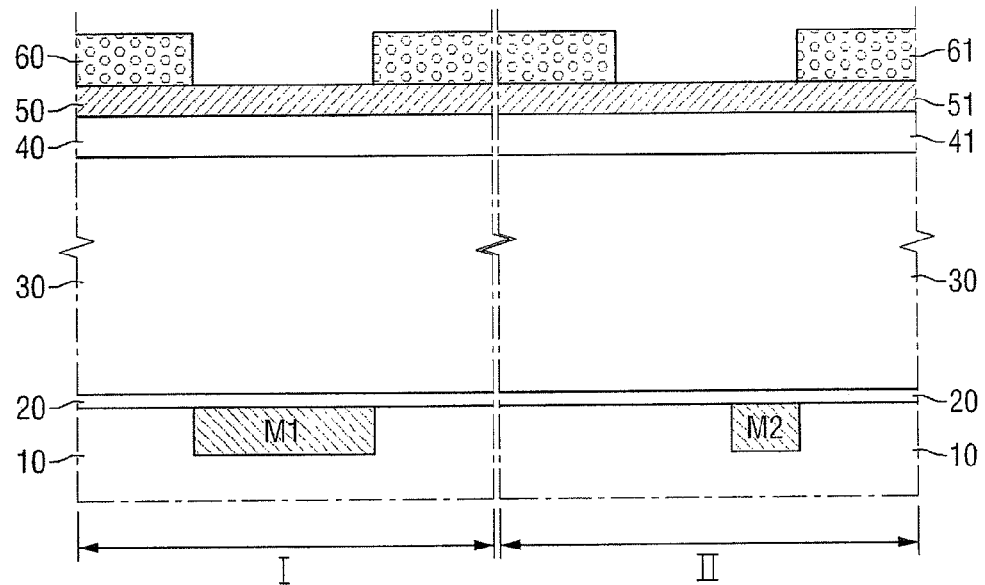
FIGS. 13 to 22 are cross-sectional views illustrating intermediate process steps in the method for fabricating a semiconductor device according to the flow chart of FIG. 12.

Referring to FIG. 13, a first hard mask pattern 40 and a second hard mask pattern 50 are sequentially stacked on a first region I of an interlayer dielectric film 30. A first photoresist pattern 60 for forming a first trench (not shown) is formed on the second hard mask pattern 50. Further, a third hard mask pattern 41 and a fourth hard mask pattern 51 are sequentially stacked on a second region II of the interlayer dielectric film 30, and a third photoresist pattern 61 for forming a second trench (not shown) is formed on the fourth hard mask pattern 51.

An etch stopper layer 20 and an insulation layer 10 having a first wire M1 formed therein are disposed under the interlayer dielectric film 30 of the first region I, and an etch stopper layer 20 and an insulation layer 10 having a second wire M2 formed therein are disposed under the interlayer dielectric film 30 of the second region II.

Figure 14:
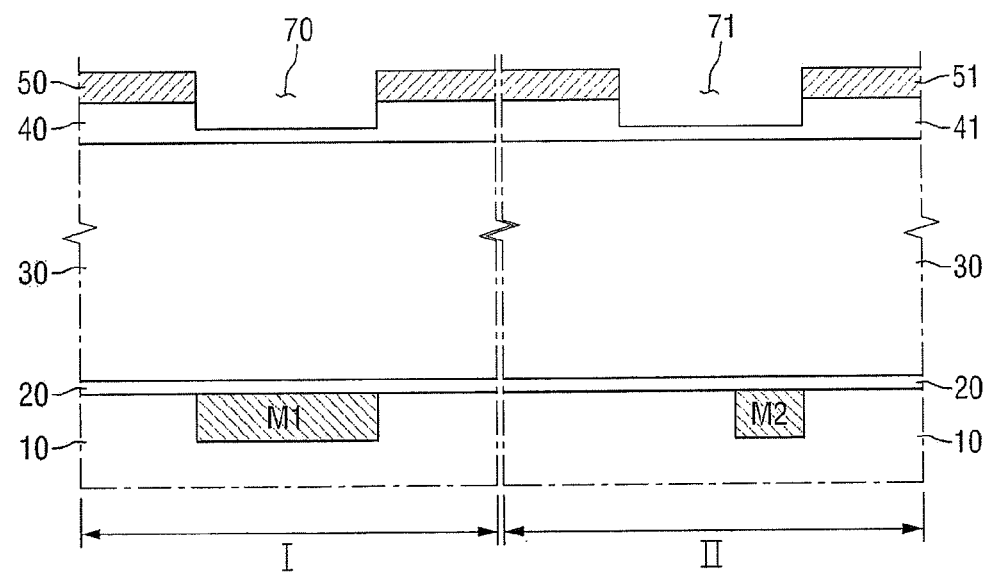

Next, referring to FIGS. 13 and 14, a first trench 70 is formed within the first and second hard mask patterns 40 and 50 using the first photoresist pattern 60 as an etch mask, and a second trench 71 is formed within third and fourth hard mask patterns 41 and 51 using a third photoresist pattern 61 as an etch mask. In the present example embodiments, the first trench is formed through the second hard mask pattern 50 and partially through the first hard mask pattern 40, and the second trench is formed through the fourth hard mask pattern 51 and partially through the third hard mask pattern 41. Other variations are possible and within the scope of the present inventive concepts.

Figure 15:
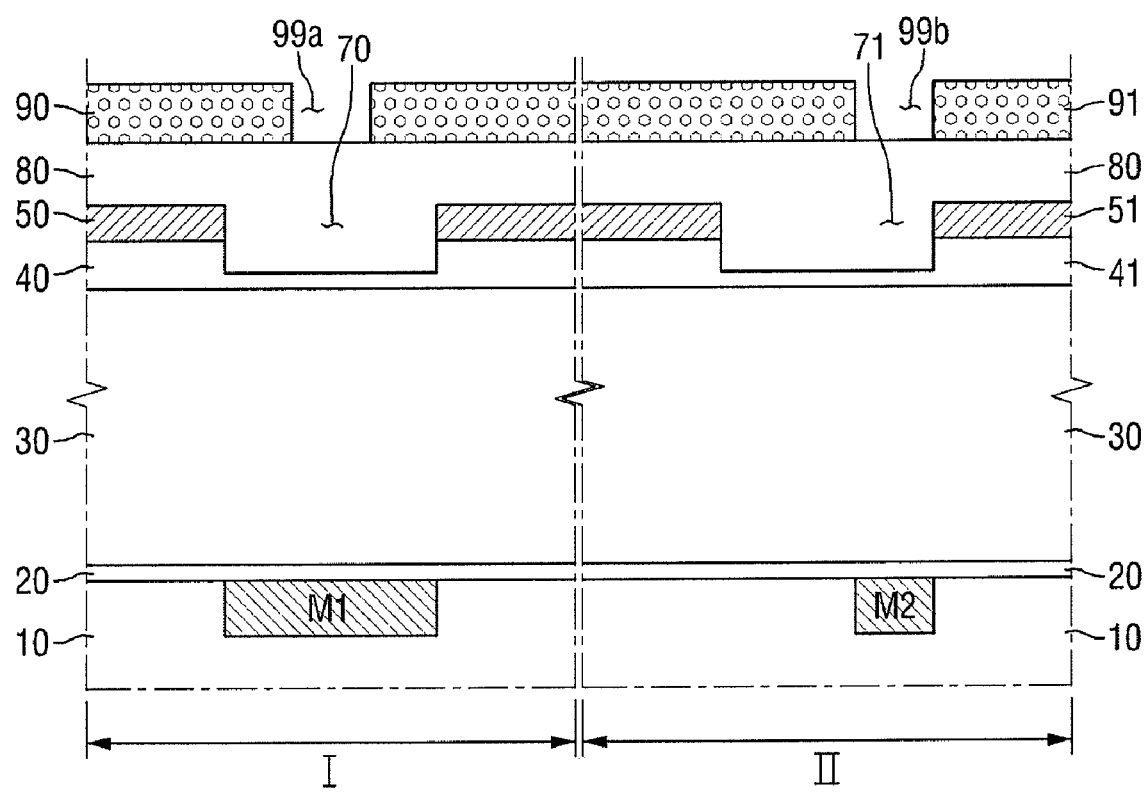
Figure 16A:
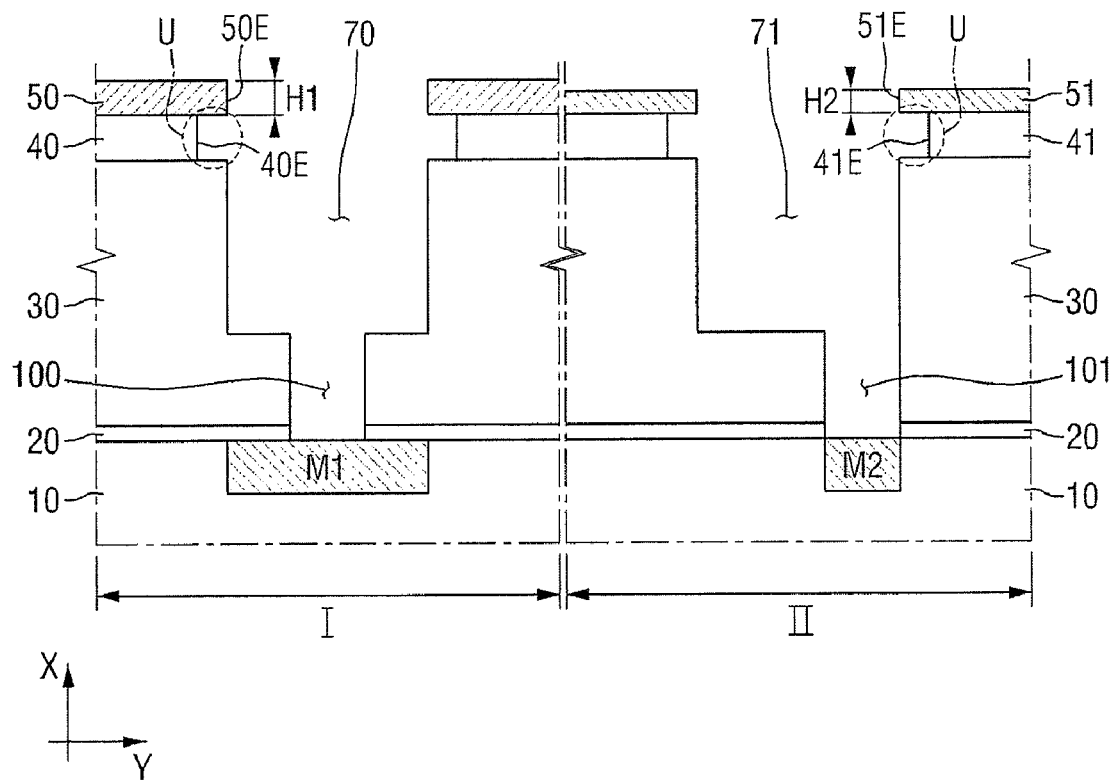
Figure 16B:
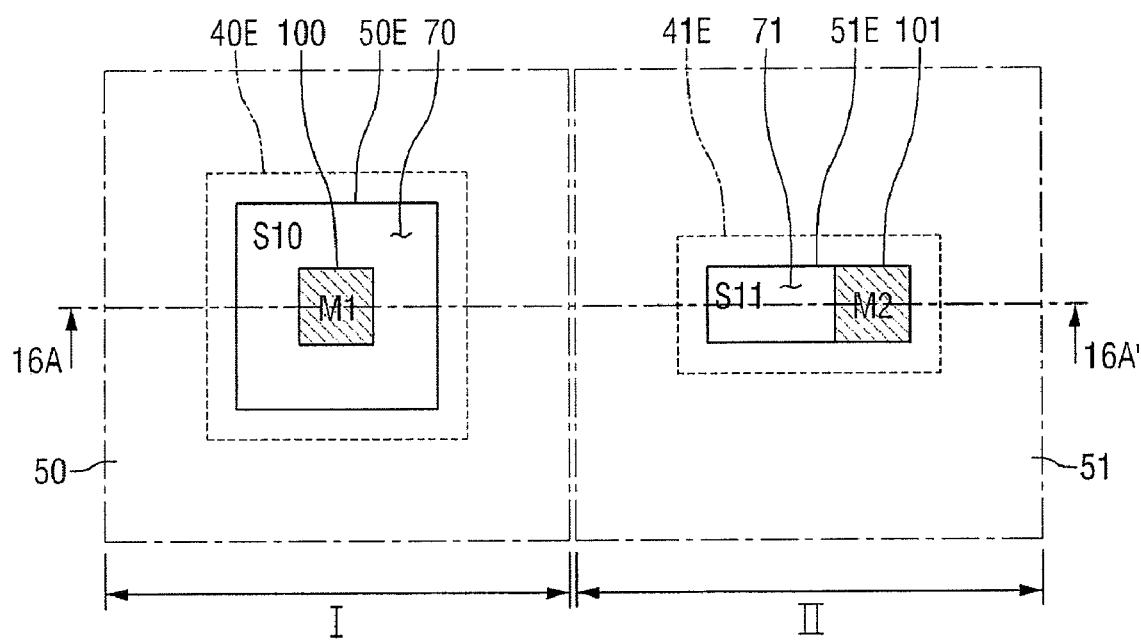

Next, referring to FIG. 15, an etching layer 80 is formed on the first and second hard mask patterns 40 and 50 to fill the first trench 70, and a second photoresist pattern 90 having an opening 99a to be used for forming a first via hole (not shown) is formed on the etching layer 80. In addition, an etching layer 80 is formed on the third and fourth hard mask patterns 41 and 51 to fill the second trench 71, and a fourth photoresist pattern 91 having an opening 99a to be used for forming a second via hole (not shown) is formed on the etching layer 80.

Referring to FIGS. 15, 16A and 16B, the etching layer 80 and portions of the first hard mask pattern 40 and the interlayer dielectric film 30 of the first region I are etched using the second photoresist pattern 90 as an etch mask and the etching layer 80 and portions of the third hard mask pattern 41 and the interlayer dielectric film 30 of the second region II are etched using the fourth photoresist pattern 91 as an etch mask. This forms an initial, relatively narrow trench in the ILD film 30. Subsequently, the second and fourth photoresist patterns 90 and 91 and the etching layer 80 are removed, the interlayer dielectric film 30 of the first region I and the interlayer dielectric film 30 of the second region II and the etch stopper layer 20 are etched using the second and fourth hard mask patterns 50 and 51 as etch masks. As a result, a first via hole 100 is formed through a lower portion of the ILD film 30 and the etch stopper layer 20. The upper portion of the first via hole 100 communicates with the first trench 70 which is formed through the upper portion of the ILD layer 30. The first trench 70 is relatively wider in dimension than the first via hole 100. Also, as a result, a second via hole 101 is formed through a lower portion of the ILD film 30 and the etch stopper layer 20. The upper portion of the second via hole 101 communicates with the second trench 71 which is formed through the upper portion of the ILD layer 30. The second trench 71 is relatively wider in dimension than the second via hole 101.

Referring to FIGS. 16A and 16B, the resulting semiconductor device may thus include first and second via holes 100 and 101 formed in the interlayer dielectric film 30 of the first region I and the second region II, the first and second trenches 70 and 71, the first and second hard mask patterns 40 and 50 sequentially stacked on the interlayer dielectric film 30 while exposing the first trench 70 of the interlayer dielectric film 30, and the third and fourth hard mask patterns 41 and 51 sequentially stacked while exposing the second trench 71.

In this example embodiment, a resulting height H1 of the second hard mask pattern 50 may be different than a height H2 of the fourth hard mask pattern 51 in accordance with the difference between relative positions of formed via holes or etching conditions. In the illustrated embodiment, the height H1 of the second hard mask pattern 50 is larger than the height H2 of the fourth hard mask pattern 51, but embodiments of the present inventive concepts are not limited thereto. Alternatively, the height H2 of the fourth hard mask pattern 51 may be larger than the height H1 of the second hard mask pattern 50.

Sidewalls of the first and second hard mask patterns 40 and 50, in combination, and sidewalls of the third and fourth hard mask patterns 41 and 51, in combination, may have an inwardly tapered, negative slope, respectively, as a result of the etching process.

Referring to FIG. 16B, an upper surface of the bottom of the first trench 70 exposed by the first and second hard mask patterns 40 and 50 may have a first area S10. In addition, an upper surface of the bottom of the second trench 71 exposed by the third and fourth hard mask patterns 41 and 51 may have a third area S11, which has been described above in detail, and a detailed description thereof will not be given.

Referring back to FIG. 12, a filler material is provided to fill the first and second trenches (S210). Further, the first to fourth hard mask trimming patterns are formed by trimming sidewalls of the first to fourth hard mask patterns while removing the filler material (S220).

Figure 17:
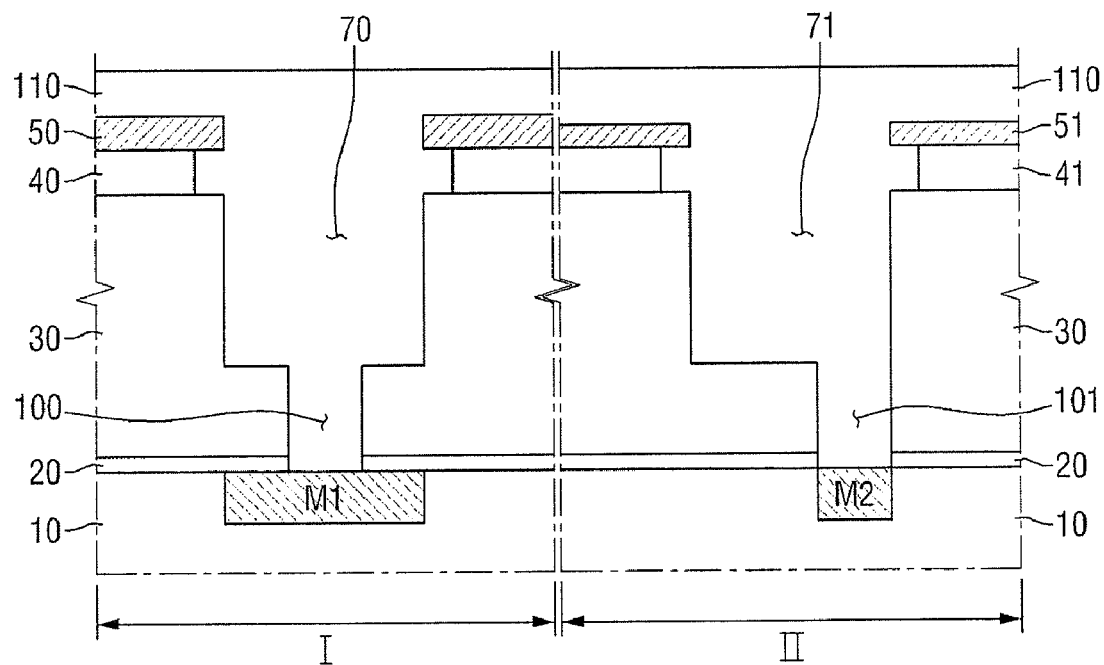
Figure 18:
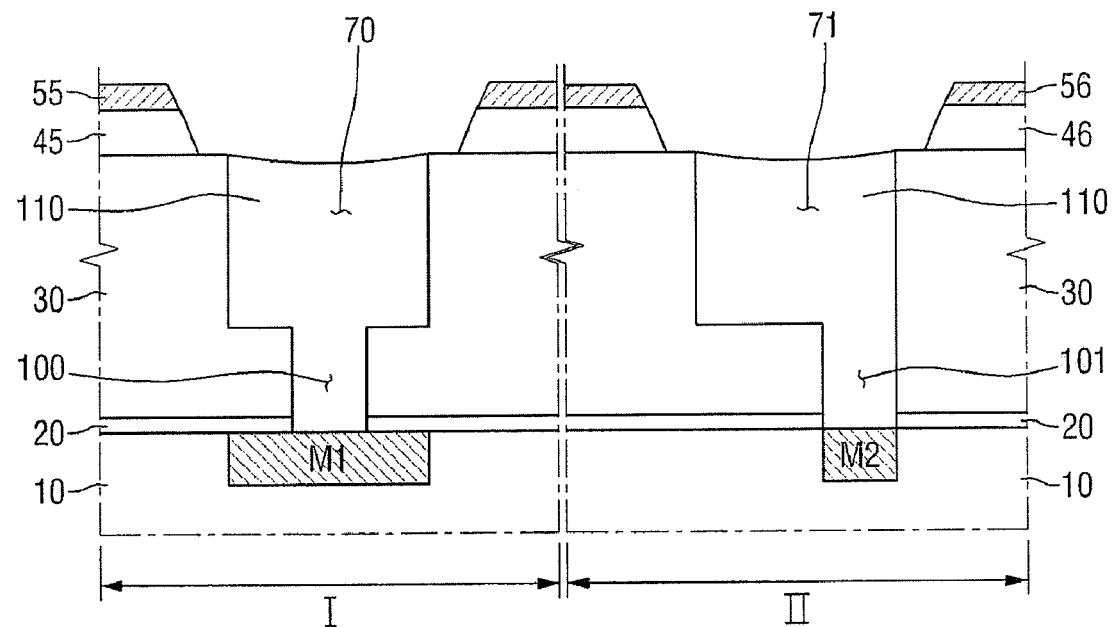

Referring to FIG. 17, a filler material 110 is formed on the first region I and the second region II of the interlayer dielectric film 30 and the first to fourth hard mask patterns 40, 41, 50 and 51 to fill the first and second trenches 70 and 71, respectively. Here, the filler material 110 may be formed to also fill first and second via holes 100 and 101, respectively, as shown in FIG. 17, although a fill of the first via hole at the lower portion of the first trench 70 is not required.

Referring to FIGS. 17 to 19B, first to fourth hard mask trimming patterns 45, 46, 55 and 56 are formed by trimming the inner sidewalls of the first to fourth hard mask patterns 40, 41, 50 and 51 while removing at least an upper portion of the filler material 110 to expose the portion of the filler material positioned at an upper portion of the first trench 70 and the second trench 71 through the first dry etching process, and to remove the remaining portion of the filler material through the second dry etching process, as described herein.

As a result, inner edges, or ends 55E of the second hard mask trimming pattern 55 and inner edges, or ends 56E of the fourth hard mask trimming pattern 56 may expose inner edges or ends 45E of the first hard mask trimming pattern 45 and inner edges or ends 46E of the third hard mask trimming pattern 46 by etching in a horizontal direction (e.g., in the X direction). Thus, the inner sidewalls of the first to fourth hard mask trimming patterns 45, 46, 55 and 56 may be considered to have a positive slope.

Meanwhile, an upper surface area of the first trench 70 exposed by the first and second hard mask trimming patterns 45 and 55, that is, a second area S20, and an upper surface area of the second trench 71 exposed by the third and fourth hard mask trimming patterns 46 and 56, that is, a fourth area S21, may be greater than an upper surface area of the first trench 70 exposed by the first and second hard mask patterns 40 and 50, that is, a first area(S10 in FIG. 16B) and an upper surface area of the second trench 71 exposed by the third and fourth hard mask patterns 41 and 51, that is, a third area (S11 in FIG. 16B), respectively.

Here, the second hard mask pattern 50 and the fourth hard mask pattern 51 may be etched in a vertical direction (e.g., in the X direction) through the first and second dry etching processes. Thus, a resulting height H3 of the second hard mask trimming pattern 55 may be less than a resulting height (H1 in FIG. 16A) of the second hard mask pattern 50, and a resulting height H4 of the fourth hard mask trimming pattern 56 may be less than a resulting height (H2 in FIG. 16A) of the fourth hard mask pattern 51. In particular, in this embodiment, a height difference (H3-H4) between the second hard mask trimming pattern 55 and the fourth hard mask trimming pattern 56 may be less than a height difference (H1-H2 in FIG. 16A) between the second hard mask pattern 50 and the fourth hard mask pattern 51.

Referring back to FIG. 12, a barrier layer is formed (S230), and a damascene wire is then formed (S240).

Figure 20:
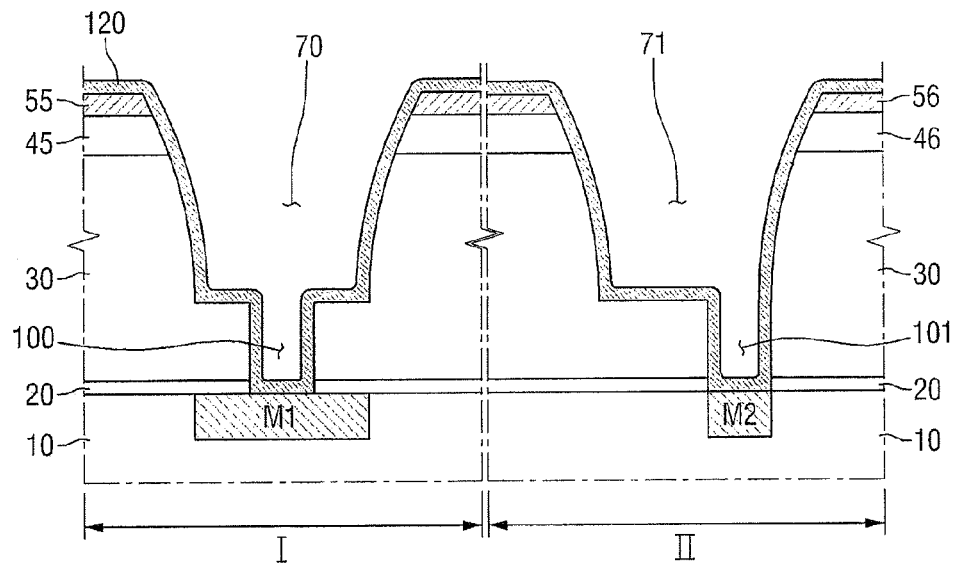
Figure 21:
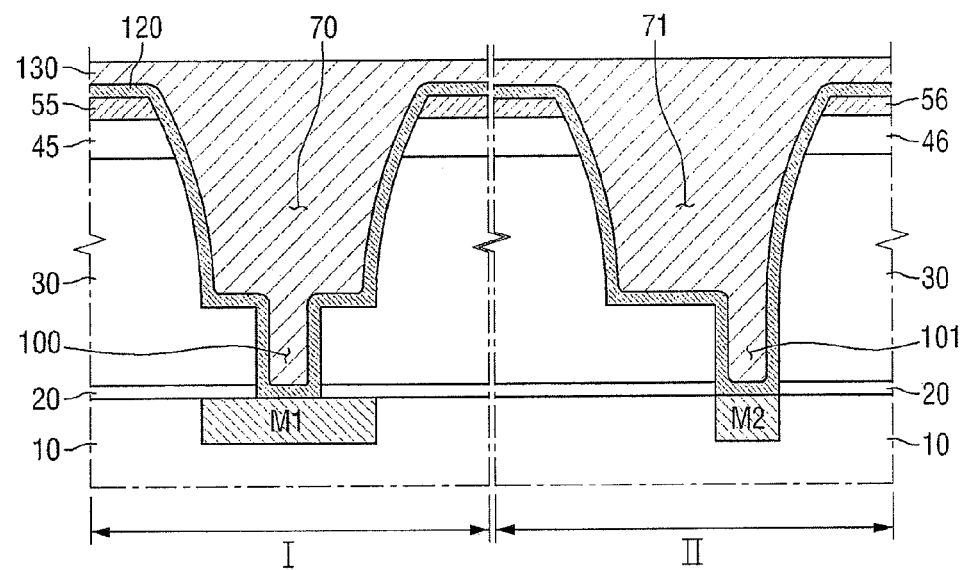

In detail, referring to FIG. 20, a barrier layer 120 is formed along sidewalls and bottom surfaces of first and second trenches 70 and 71 and first and second via holes 100 and 101 and along sidewalls and a top surface of the first to fourth hard mask trimming patterns 45, 46, 55 and 56, as described herein. Referring to FIG. 21, a conductive material 130 is formed on the barrier layer 120 to fill the first and second trenches 70 and 71 and the first and second via holes 100 and 101, as described herein.

Figure 22:
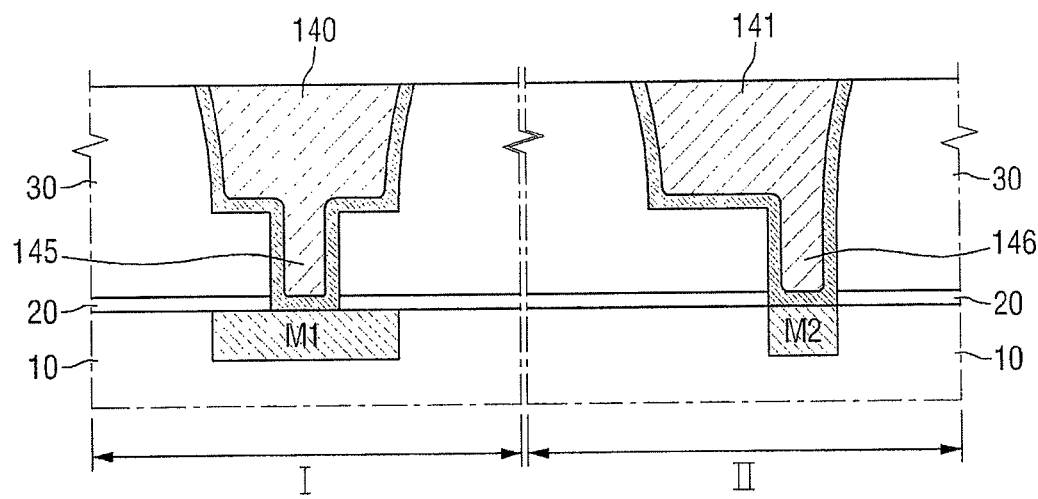

Next, referring to FIGS. 21 and 22, a planarizing process is performed to expose top surfaces of first and second regions I and II of the interlayer dielectric film 30, thereby removing the first to fourth hard mask trimming patterns 45, 46, 55 and 56 and forming a first damascene wire 140 including a first via 145 and a second damascene wire 141 including a second via 146, as described herein.

In the present embodiment, in the event a height difference (H3-H4 in FIG. 19A) between the second hard mask trimming pattern 55 and the fourth hard mask trimming pattern 56 is less in magnitude than a height difference (H1-H2 in FIG. 16A) between the second hard mask pattern 50 and the fourth hard mask pattern 51, the processing efficiency of a subsequent planarization process for removing the first to fourth hard mask trimming patterns 45, 46, 55 and 56 can be improved.

Next, a method for fabricating a semiconductor device according to still another embodiment of the present inventive concepts will be described with reference to FIGS. 23 to 25.

Figure 23:
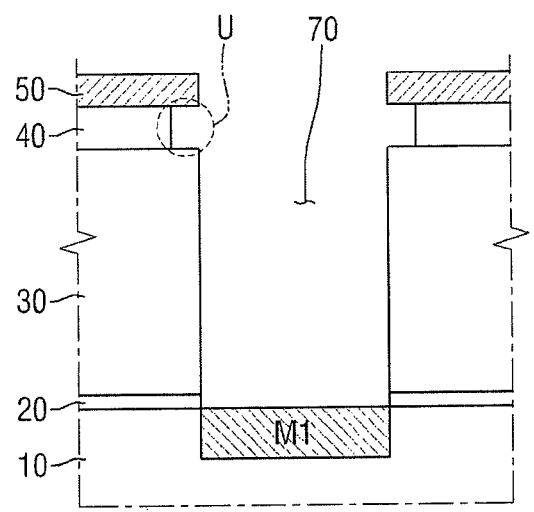
FIGS. 23 to 25 are cross-sectional views illustrating intermediate process steps in the method for fabricating a semiconductor device according to another embodiment of the present inventive concepts.
Figure 24:
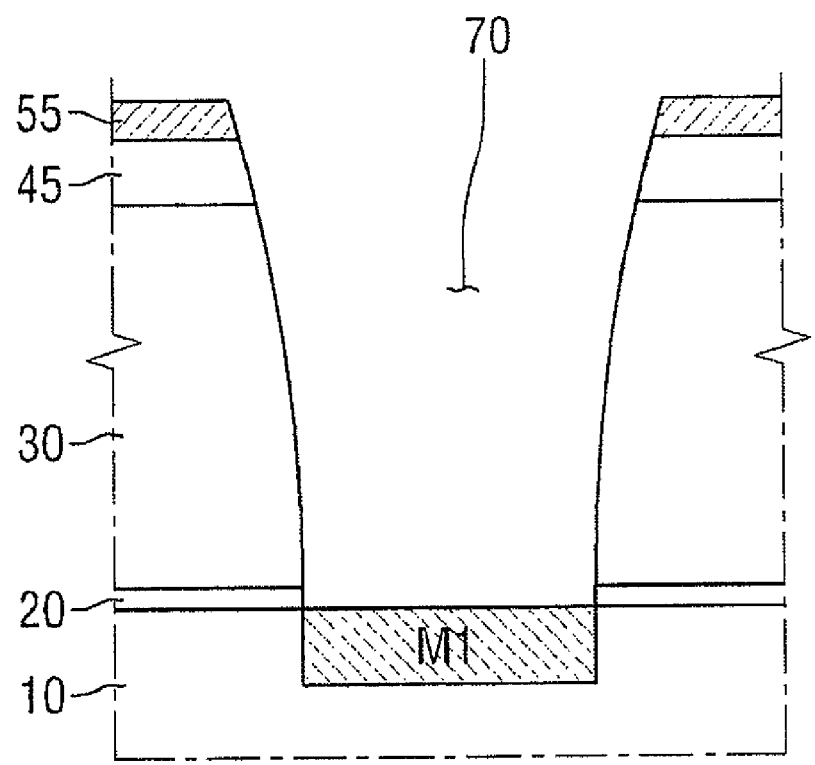
Figure 25:
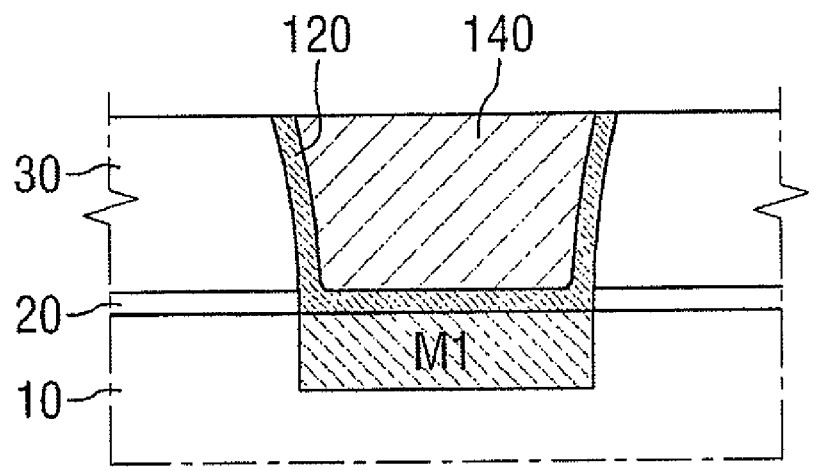

FIGS. 23 to 25 are cross-sectional views illustrating intermediate process steps in the method for fabricating a semiconductor device according to still another embodiment of the present inventive concepts.

Referring to FIG. 23, a semiconductor device is provided, the semiconductor device including a first trench 70 formed in an interlayer dielectric film 30, and first and second hard mask patterns 40 and 50 sequentially stacked on the interlayer dielectric film 30 while exposing the first trench 70. This embodiment is different from the previous embodiments in that a first via hole 100 extending to a first wire M1 is not formed. Since an exemplary embodiment of the method for forming the semiconductor device may be inferred from the previous embodiments, and a repeated explanation thereof will not be given.

Referring to FIG. 24, a filler material 110 (see FIG. 6) is formed to fill the first trench 70 on the interlayer dielectric film 30 and the first and second hard mask patterns 40 and 50.

Then, first and second hard mask trimming patterns 45 and 55 are formed by trimming inner sidewalls of the first and second hard mask patterns 40 and 50 while removing the filler material 110 to expose the first trench 70.

Next, referring to FIG. 25, a barrier layer 120 is formed in the first trench 70 and on the exposed first hard mask trimming pattern 45 and the second hard mask trimming pattern 55, and a damascene wire 140 is formed in the first trench 70 by filling a conductive material 130. Here, in the present example, the damascene wire 140 does not include a first via (145 in FIG. 11).

While embodiments of the present inventive concepts have been particularly shown and described with reference to exemplary embodiments thereof, it will be understood by those of ordinary skill in the art that various changes in form and details may be made therein without departing from the spirit and scope as defined by the following claims. It is therefore desired that the present embodiments be considered in all respects as illustrative and not restrictive, reference being made to the appended claims rather than the foregoing description to indicate the scope of the inventive concepts.

What is claimed is:

1. A method for fabricating a semiconductor device, the method comprising:
providing a semiconductor device including an interlayer dielectric film and first and second hard mask patterns sequentially stacked thereon;
providing a first trench in the interlayer dielectric film through the second hard mask pattern and the first hard mask pattern;
providing a filler material on the interlayer dielectric film and the first and second hard mask patterns to fill the first trench;
forming first and second hard mask trimming patterns by trimming sidewalls of the first and second hard mask patterns and removing the filler material to expose the first trench; and
forming a damascene wire by filling the first trench with a conductive material.

2. The method of claim 1, wherein sidewalls of the first and second hard mask patterns in the region of the trench have a negative slope.

3. The method of claim 2, wherein the first hard mask pattern has an undercut formed therein, relative to the second hard mask pattern.

4. The method of claim 1, wherein the trimming comprises forming the first and second hard mask trimming patterns to have sidewalls of a positive slope.

5. The method of claim 1, wherein the forming of the first and second hard mask trimming patterns is performed using a dry etching process.

6. The method of claim 5, wherein the dry etching process includes a first dry etching process to form first and second hard mask trimming patterns by trimming the sidewalls of the first and second hard mask patterns while removing the filler material to expose an upper surface of the first trench using a first gas, and a second dry etching process to remove the filler material in the first trench using a second gas.

7. The method of claim 6, wherein the first hard mask pattern and the filler material have higher etching selectivity to the first gas than the second hard mask pattern, and wherein the filler material has higher etching selectivity to the second gas than the first and second hard mask patterns.

8. The method of claim 7, wherein the first hard mask pattern includes tetraethyl orthosilicate (TEOS), the second hard mask pattern includes titanium nitride (TiN), and the filler material includes at least one of near frictionless carbon (NFC) and spin-on hard mask (SOH).

9. The method of claim 1, wherein before the forming of the damascene wire, further comprising forming a barrier layer along sidewalls and a bottom surface of the first trench and along sidewalls and a top surface of the first and second hard mask trimming patterns.

10. The method of claim 9, wherein the forming of the damascene wire comprises:
    forming the conductive material on the barrier layer to fill the first trench; and
    planarizing to expose a top surface of the interlayer dielectric film.

11. The method of claim 1, wherein the first trench is provided in a first region of the interlayer dielectric film, and further comprising providing a second trench in the interlayer dielectric film through a third hard mask pattern and a fourth hard mask pattern in a second region of the interlayer dielectric film;
    wherein providing a filler material further comprises providing the filler material to fill the second trench;
    wherein forming of the first and second hard mask trimming patterns further comprises forming third and fourth hard mask trimming patterns by trimming sidewalls of the third and fourth hard mask patterns and removing the filler material to expose the second trench; and
    wherein forming the damascene wire further comprises filling the second trench with a conductive material.

12. The method of claim 11, wherein a height difference between the second hard mask trimming pattern and the fourth hard mask trimming pattern is less than a height difference between the second hard mask pattern and the fourth hard mask pattern.

13. A method for fabricating a semiconductor device, the method comprising:
    providing a semiconductor device including an interlayer dielectric film and first and second hard mask patterns sequentially stacked thereon;
    providing a first trench in the interlayer dielectric film through the second hard mask pattern and the first hard mask pattern, inner ends of the second hard mask pattern overlapping undercut portions of inner ends of the first hard mask pattern;
    providing a filler material on the interlayer dielectric film and the first and second hard mask patterns to fill the first trench;
    forming first and second hard mask trimming patterns by trimming the inner ends of the first and second hard mask patterns and removing the filler material to expose the first trench; the second hard mask trimming pattern exposing at least a portion of the inner end of the first hard mask trimming pattern;
    forming a barrier layer along sidewalls and a bottom surface of the first trench and along sidewalls and a top surface of the first and second hard mask trimming patterns; and
    forming a damascene wire by filling the first trench with a conductive material.

14. The method of claim 13, wherein an upper surface area of the first trench exposed by the first and second hard mask trimming patterns is larger than an upper surface area of the first trench exposed by the first and second hard mask patterns.

15. The method of claim 13,
    wherein the first trench is provided in a first region of the interlayer dielectric film, and further comprising providing a second trench in the interlayer dielectric film through a third hard mask pattern and a fourth hard mask pattern in a second region of the interlayer dielectric film;
    wherein providing a filler material further comprises providing the filler material to fill the second trench;
    wherein forming of the first and second hard mask trimming patterns further comprises forming third and fourth hard mask trimming patterns by trimming the inner ends of the third and fourth hard mask patterns and removing the filler material to expose the second trench; and
    wherein forming the damascene wire further comprises filling the second trench with a conductive material.

16. The method of claim 15, wherein an upper surface area of the first trench exposed by the first and second hard mask trimming patterns is larger than an upper surface area of the first trench exposed by the first and second hard mask patterns, and wherein an upper surface area of the second trench exposed by the third and fourth hard mask trimming patterns is larger than an upper surface area of the second trench exposed by the third and fourth hard mask patterns.

17. A method of fabricating a semiconductor device, comprising:
    providing a first hard mask layer on an interlayer dielectric film and providing a second hard mask layer on the first hard mask layer, the second hard mask layer having etch selectivity relative to the first hard mask layer;
    forming a trench through the second hard mask layer, the first hard mask layer and the interlayer dielectric film, the trench forming a first opening through the first hard mask layer and the trench forming a second opening through the second hard mask layer, the first opening being larger in area that the second opening;
    filling the trench with a filler material, the filler material at least partially filling the trench in the interlayer dielectric film, and the first and second openings;
    trimming the first and second openings in the first and second hard mask layers so that the second opening is larger in area than the first opening;
    removing the filler material to expose a component of the semiconductor device positioned below the interlayer dielectric film.

18. The method of claim 17 further comprising:
    after removing the filler material, conformally forming a barrier layer on sidewalls and a bottom of the trench; and
    filling the trench, including the barrier layer, with a conductive material.

19. The method of claim 17 wherein:
    after forming the trench, the first opening is larger in area that the second opening, and inner sidewalls of the first and second openings have a negative slope; and
    after trimming the first and second openings, the second opening is larger in area that the first opening, and inner sidewalls of the first and second openings have a positive slope.

20. The method of claim 17 wherein:
    after forming the trench, the first opening is larger in area that the second opening, and an undercut is present in the first opening below the second opening; and
    after trimming the first and second openings, the second opening is larger in area that the first opening, and the undercut is substantially removed.

* * * * *